United States Patent

Nakahara

[11] Patent Number: 5,914,678
[45] Date of Patent: Jun. 22, 1999

[54] TRIPLET DECODING CIRCUIT AND TRIPLET DECODING METHOD

[75] Inventor: Masanao Nakahara, Kanagawa, Japan

[73] Assignee: NEC Corporation, Tokyo, Japan

[21] Appl. No.: 08/917,276

[22] Filed: Aug. 25, 1997

[30] Foreign Application Priority Data

Aug. 23, 1996 [JP] Japan .................................... 8-222337

[51] Int. Cl.$^6$ .................................................. H03M 7/00
[52] U.S. Cl. ................................................. 341/50; 341/50
[58] Field of Search ................................................. 341/50

[56] References Cited

U.S. PATENT DOCUMENTS 3,956,578  5/1976  de Loye et al. ........................ 358/433

*Primary Examiner*—Howard L. Williams
*Attorney, Agent, or Firm*—Foley & Lardner

[57] ABSTRACT

A triplet decoding method capable of decoding operation in a short time is provide, in which a triplet data Y is defined as Y=9M1+3M2+M3. A first decimal value −9 is subtracted from a decimal value Y to generate a first subtraction result. A second decimal value −18 is subtracted from the value of Y to generate a second subtraction result. A third decimal value −27 is subtracted from Y to generate a third subtraction result. Then, whether each of the first, second, and third subtraction results has a negative polarity is judged to know M1. A provisional triplet data Y' is calculated by subtracting 9M1 from Y. Further, the first value −9 is subtracted from a value of Y' to generate a fourth subtraction result. The second value −18 is subtracted from the value of Y' to generate a fifth subtraction result. The third value −27 is subtracted from the value of Y' to generate a sixth subtraction result. Then, whether each of the fourth, fifth, and sixth subtraction results has a negative polarity or not is judged to know the second decimal number M2. The third decimal number M3 is calculated by substracting a value of 3M2 from the value of the provisional triplet data Y'.

14 Claims, 11 Drawing Sheets

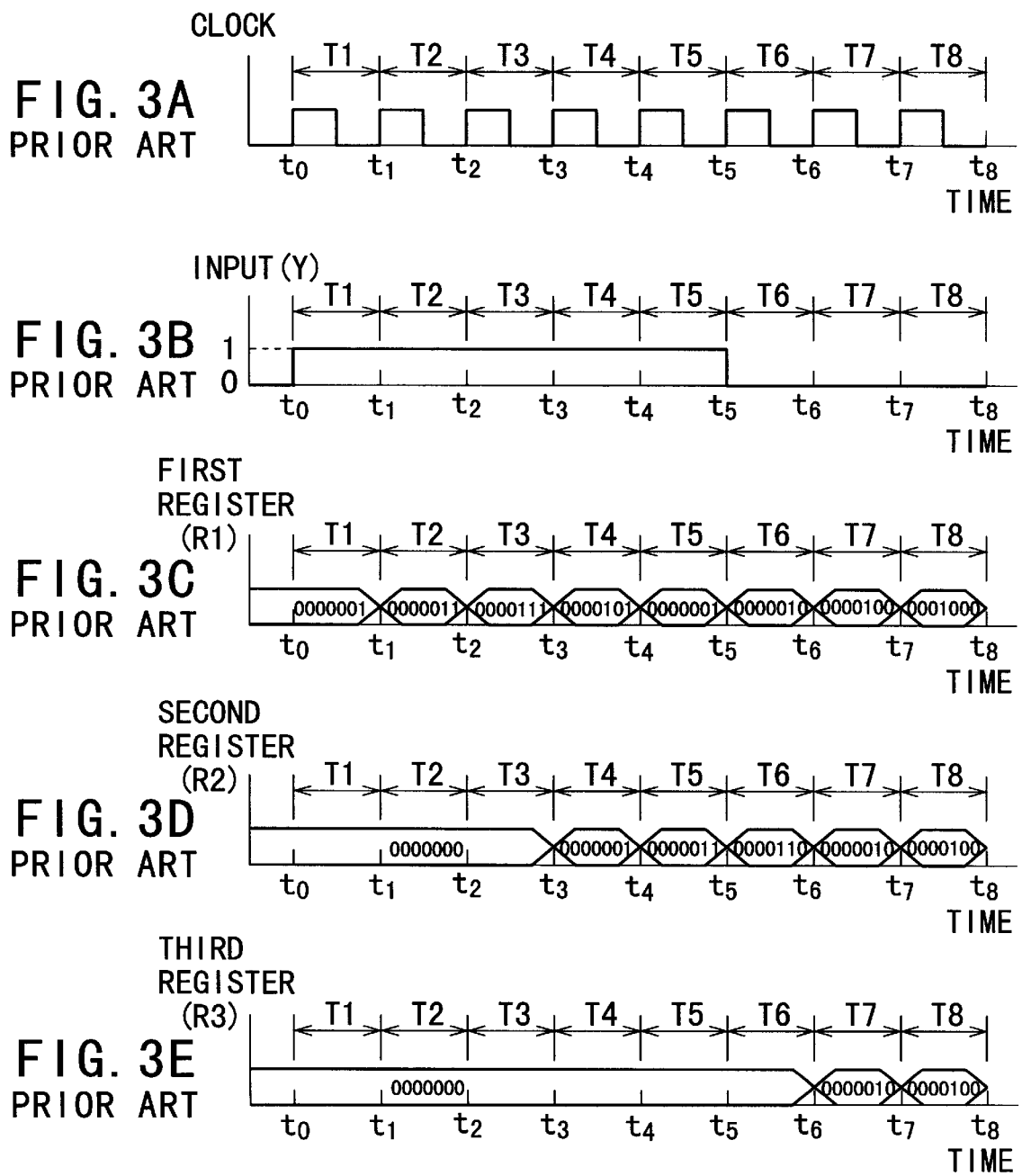

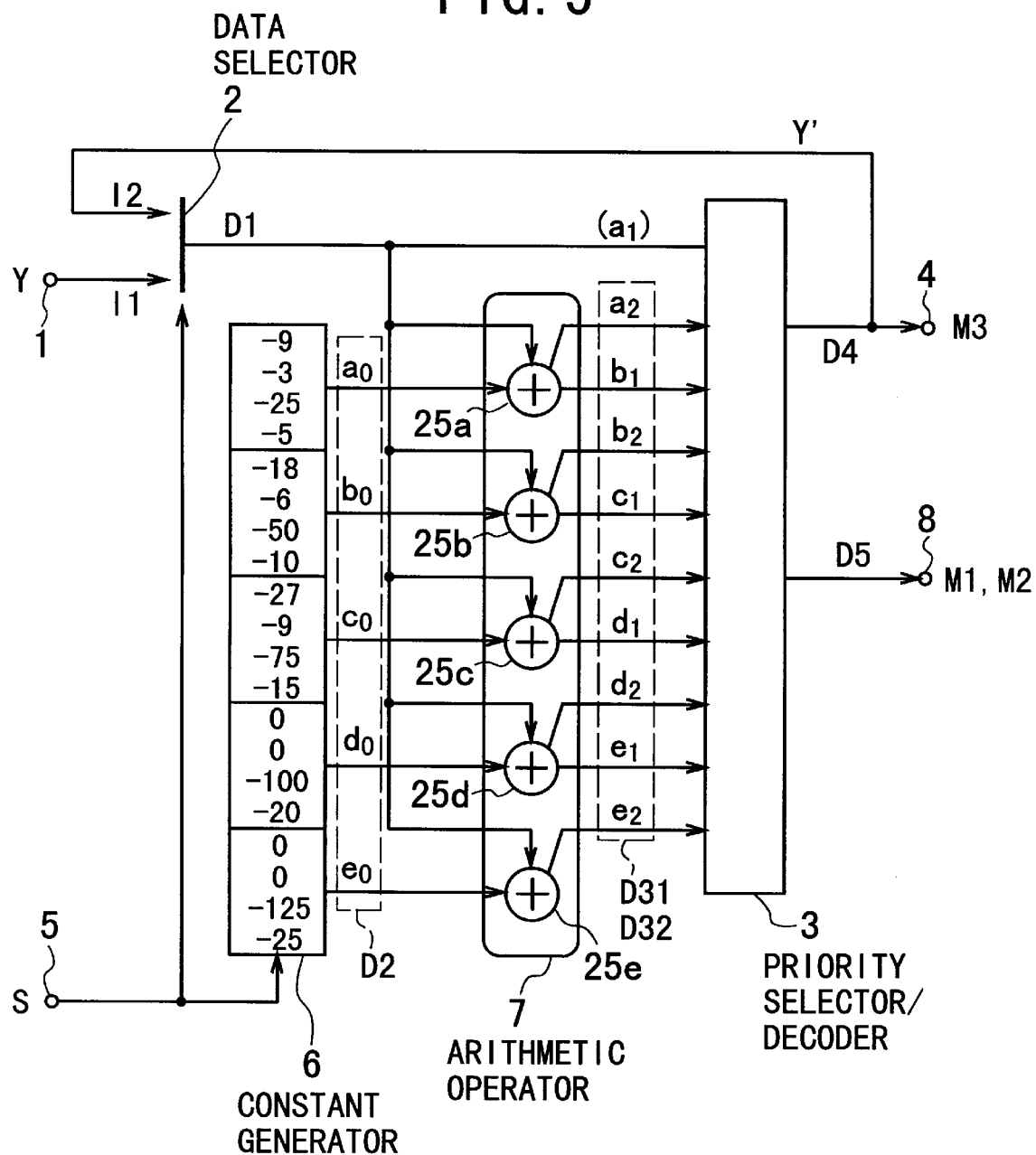

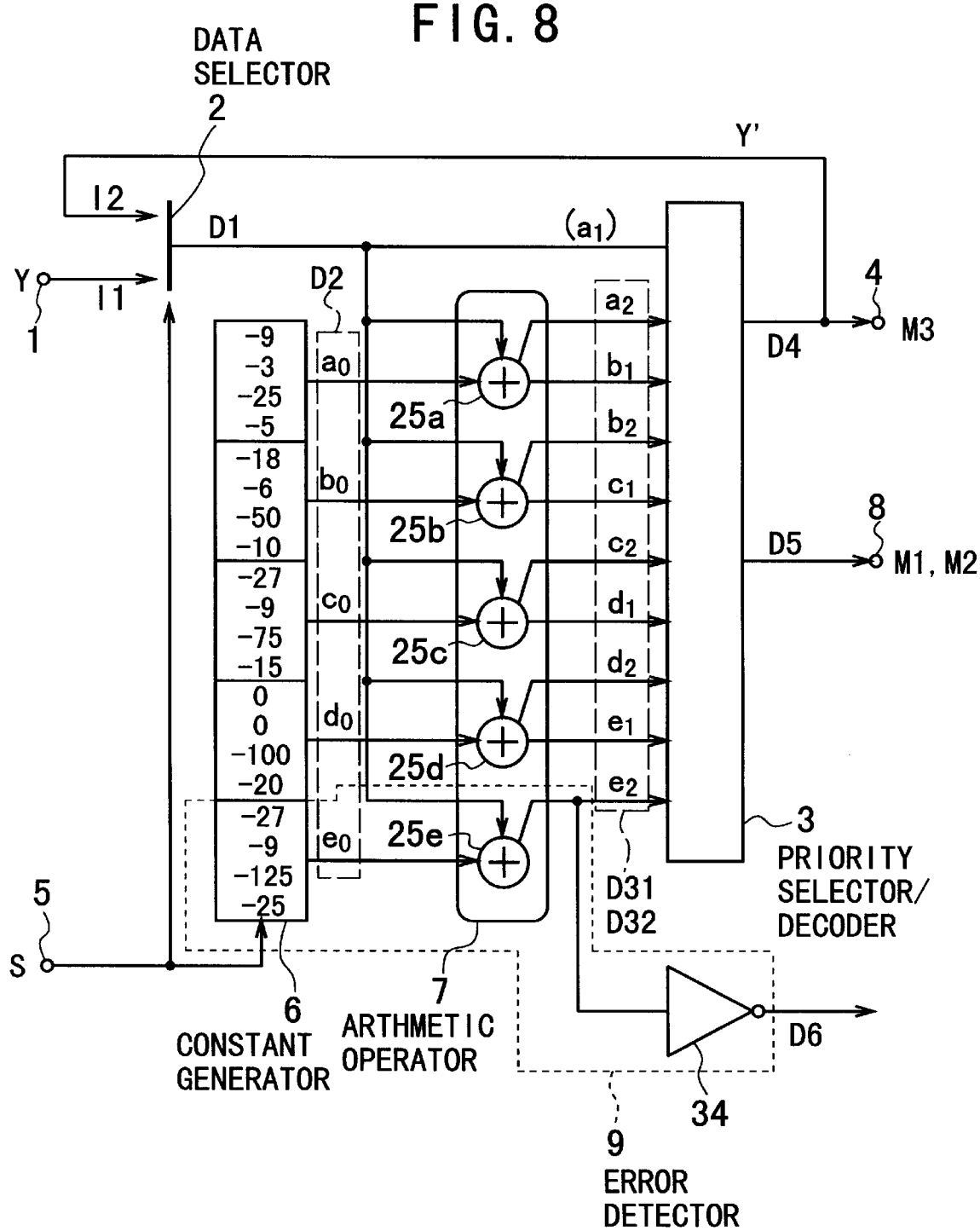

TRIPLET DECODING CIRCUIT AND TRIPLET DECODING METHOD

BACKGROUND OF THE INVENTION

1. Field of the Invention

The present invention relates to a triplet decoding process and more particularly, to a triplet decoding circuit and a triplet decoding method that decode or expand the data of a "triplet", which is generated by compressing three original data into a single one for the purpose of data amount decrease, to restore the original data.

2. Description of the Prior Art

Image data for television fields and audio data for Compact Disk (CD) fields are vast in amount. Therefore, to perform efficient transmission of these data or efficient recording of these data on various media such as magnetic tapes, magnetic disks, and optical disks, they are usually compressed prior to transmission or recording. Then, the compressed data are expanded or decoded in the receiving side or in reading the data to restore or return the three original data.

With this type of data compression/expansion technology, three original data in a certain range are converted or coded into a signal one to produce a compressed data known as a "triplet", and the data of the triplet is than expanded or decoded to restore the original three data as necessary. This data compression/expansion technology has an advantage that the data length of the triplet data is shorter than the total length of the three original data.

As the triplet data, a triplet of a decimal number "3", which is the sum of three original data each multiplied by a different value of power of 3, and a triplet of a decimal number "5", which is the sum of three original data each multiplied by a different value of power of 5, have been often used.

If a triplet of 3 is represented by "Y3", the triplet data Y3 is defined as the sum of three original data M1, M2, and M3 multiplied respectively by decimal number "9" ($=3^2$), "3" ($=3^1$), and "1" ($=3^0$), as shown in the following equation (1).

$$Y3 = 9 \times M1 + 3 \times M2 + M3 \quad (1)$$

In the equation (1), each of the original data M1, M2, and M3 has a value of 0, 1, or 2 in the decimal number system. Thus, the triplet data Y3 may have any value ranging from 0 to 26 (i.e., $0 \leq Y3 \leq 26$).

The maximum value of Y3, i.e., a decimal number "26", is represented as "11010" in the binary number system, which requires five bits. On the other hand, each of the three original data M1, M2, and M3 is any one of the decimal numbers 0 (=00), 1 (=01), and 2 (=10), each of which necessitates two bits. Therefore, six bits are necessary in total to represent the three original data M1, M2, and M3. Accordingly, the triplet data Y3 is smaller in data amount than the sum of the three original data M1, M2, and M3 by one bit.

Likewise, if a triplet of 5 is represented by "Y5", the triplet data Y5 is defined as the sum of three original data M1, M2, and M3 respectively multiplied by decimal number "25" ($=5^2$), "5" ($=5^1$), and "1" ($=5^0$), as shown in the following equation (2).

$$Y5 = 25 \times M1 + 5 \times M2 + M3 \quad (2)$$

In the equation (2), each of the original data M1, M2, and M3 has a value of 0, 1, 2, 3, or 4 in the decimal number system. Thus, the triplet data Y5 may have any value ranging from 0 to 124 (i.e., $0 \leq Y5 \leq 124$).

The maximum value of Y5, i.e., a decimal number "124", is represented as "1111100" in the binary number system, which requires seven bits. On the other hand, each of the three original data M1, M2, and M3 is any one of the decimal numbers 0 (=000), 1 (=001), 2 (=010), 3 (=011), and 4 (=100), each of which necessitates three bits. Therefore, nine bits are necessary in total to represent the three original data M1, M2, and M3. Accordingly, the triplet data Y5 is smaller in data amount than the sum of the three original data M1, M2, and M3 by two bits.

Next, the above conventional triplet technology will be described in greater detail below with the use of FIG. 1, FIGS. 2A to 2I, and FIGS. 3A to 3I.

As shown in FIG. 1, a conventional triplet decoding circuit has a serial input terminal 100 that receives serially a triplet data Y (e.g., Y3 or Y5) in the binary number system and a selection-signal input terminal 103 that receives a selection signal S. The triplet data Y and the selection signal S are inputted in synchronization with a specific clock signal. The binary triplet data Y is serially inputted into the terminal 100 from its most significant bit (MSB) to its least significant bit (LSB).

According to the selection signal S, a first constant generator 102 generates a negative constant C1 of "−3" (decimal) for the triplet Y3 and of "−5" (decimal) for the triplet Y5 to output to a first adding circuit 105. Similarly, a second constant generator 107 generates a negative constant C2 of "−3" for the triplet Y3 and of "−5" for the triplet Y5 to a second adding circuit 110. Thus, each of the first and second adding circuits 105 and 110 practically performs a subtraction operation of "3" or "5".

The triplet data Y as the input data through the serial input terminal 100 is inputted into a first shift register 101 in sequence in synchronization with the clock signal, outputting a first register output R1 in parallel. This output R1 contains the content of the register 101 at that time. This output R1 is sent to a first selector 114 and at the same time, sent to the first adding circuit 105 to be added to the first constant C1 from the first constant generator 102.

The first adding circuit 105 practically subtracts the first constant C1 from the first register output R1, outputting a first subtraction result A1 to the first data selector 114. The first subtraction result A1 may be fed back to the first shift register 101 at a specific timing.

The first adding circuit 105 further outputs a first borrow output B1 generated by the subtraction operation of the first register output R1 and the first constant C1. The first borrow output B1 is sent to a second shift register 106 and then, inputted into the register 106 after inverting its polarity through a serial input terminal of the register 106. The first borrow output B1 may be fed back to the first shift register 101 at a specific timing.

The first borrow output B1 as the input data through the serial input terminal 109 is inputted into the second shift register 106 in sequence in synchronization with the clock signal, generating a second register output R2 in parallel. This output R2 is sent to a second selector 115 and at the same time, sent to a second adding circuit 110 to be added to the second constant C2 from the second constant generator 107.

The second adding circuit 110 practically subtracts the second constant C2 from the second register output R2, outputting a second subtraction result A2 to the second selector 114. The second subtraction result A2 may be fed back to the second shift register 106 at a specific timing.

The second adding circuit 110 further outputs a second borrow output B2 generated in the subtraction operation of the second register output R2 and the second constant C2. The second borrow output B2 is sent to a third shift register 111 and then, inputted into the register 111 after inverting its polarity through a serial input terminal 112 of the register 111. The second borrow output B2 may be fed back to the second shift register 106 at a specific timing.

The first selector 114 selects one of the first register output R1 and the first subtractions result A1 to output to a first output terminal 104 as a first selector output L1 according to the value of the first borrow output B1. The lower two bits of the first selector output L1 represent the original decimal number M3 contained in the triplet data Y.

The second selector 115 selects one of the second register output R2 and the second subtraction result A2 to output to a second output terminal 108 as a second selector output L2 according to the value of the second borrow data B2. The lower two bits of the second selector output L2 represent the original decimal numbers M2 contained in the triplet Y.

The third shift register 111 outputs a third register output R3 to a third output terminal 113. The lower two bits of the third register output R3 represent the original decimal numbers M1 contained in the triplet data Y.

Subsequently, the operation of the conventional triplet decoding circuit shown in FIG. 1 is explained below referring to FIGS. 2A to 2I, where a triplet of 3 is used as the triplet data Y.

Here, it is supposed that the triplet data Y is a five-bit binary number "01010", which equals "10" in the decimal number system. In this case, the first and second constant generators 102 and 107 output the same decimal number "−3" to the first and second adding circuits 105 and 110 as the constants C1 and C2, respectively.

Initially, the binary content of each shift register 101, 106, and 111 is reset as "00000".

In the clock period T1 from the time $t_0$ to the time $t_1$, the value "0" in the MSB of the triplet data Y is inputted into the first shift register 101 through the serial input terminal 100. At this time, the content of the first shift register 101 is kept as "00000", because the inputted MSB value "0" of the triplet Y is set at the LSB in the content of the register 101. This binary content "00000" is outputted as the first register output R1.

The decimal number "−3" sent from the first constant generator 102 as the first constant C1 is subtracted from the first register output R1 of "00000" in the first adding circuit 105, thereby outputting the first subtraction result A1 of "11101" and the first borrow output B1 of "1".

Since the first borrow output B1 has a binary value "1" in this period T1, and inverted value "0" is inputted into the second shift register 106 through its input terminal 109 to be set at the LSB in the content of the register 106. Therefore, the content "00000" of the second shift register 106 is not changed.

Likewise, the binary content "00000" of the second shift register 106 is outputted as the second register output R2. The decimal number "−3" sent from the second constant generator 107 as the second constant C2 is subtracted from the second register output R2 of "00000" in the second adding circuit 110, thereby outputting the second subtraction result A2 of "11101" and the second borrow output B2 of "1".

Since the second borrow output B2 has a binary value "1" in this period T1, and inverted value "0" is inputted into the third shift register 111 through its input terminal 112 to be set at the LSB in the content of the register 111. Therefore, the content "00000" of the third shift register 111 is not changed.

Next, in the clock period T2 from the time $t_1$ to the time $t_2$, the value "1" in the second MSB of the triplet data Y is inputted into the first shift register 101 through the serial input terminal 100. At this time, the content of the first shift register 101 is changed to "00001", because the inputted value "1" of the triplet data Y is set at the LSB in the content of the register 101. This binary content "00001" is outputted as the first register output R1.

The decimal number "−3" sent from the first constant generator 102 as the first constant C1 is subtracted from the first register output R1 of "00001" in the first adding circuit 105, thereby outputting the first subtractions result A1 of "11110" and the first borrow output B1 of "1".

Since the first borrow output B1 has a binary value "1" in this period T2, an inverted value "0" is inputted into the second shift register 106 through its input terminal 109 to be set at the LSB in the content of the register 106. Therefore, the content "00000" of the second shift register 106 is not changed.

Similarly, the binary content "00000" of the second shift register 106 is outputted as the second register output R2. The decimal number "−3" sent from the second constant generator 107 as the second constant C2 is subtracted from the second register output R2 of "00000" in the second adding circuit 110, thereby outputting the second subtraction result A2 of "11101" and the second borrow output B2 of "1".

Since the second borrow output B2 has a binary value "1" in this period T2, an inverted value "0" is inputted into the third shift register 111 through its input terminal 112 to be set at the LSB in the content of the register 111. Therefore, the content "00000" of the third shift register 111 is not changed.

Next, in the clock period T3 from the time $t_2$ to the time $t_3$, the value "0" in the third MSB of the triplet data Y is inputted into the first shift register 101 through the serial input terminal 100. At this time, the content of the first shift register 101 is changed to "00010". This binary content "00010" is outputted as the first register output R1.

The decimal number "−3" is subtracted from the first register output R1 of "00010" in the first adding circuit 105. Thus, the first subtraction result A1 of "11111" and the first borrow output B1 of "1" are outputted.

In this period T3, an inverted value "0" of the binary value "1" of the first borrow output B1 is inputted into the second shift register 106 to be set at the LSB in the content of the register 106. Therefore, the content "00000" of the second shift register 106 is not changed.

Similarly, the decimal number "−3" is subtracted from the second register output R2 of "00000" in the second adding circuit 110. Thus, the second subtraction result A2 of "11101" and the second borrow output B2 of "1" are outputted.

An inverted value "0" of the binary value "1" of the second borrow output B2 is inputted into the third shift register 111 to be set at the LSB in the content of the register 111 in this period T3. Therefore, the content "00000" of the third shift register 111 is not changed.

In the clock period T4 from the time $t_3$ to the time $t_4$, the value "1" in the fourth MSB of the triplet data Y is inputted into the first shift register 101. At this time, the content of the first shift register 101 is changed to "00101". This binary content "00101" is outputted as the first register output R1.

The decimal number "−3" is subtracted from the first register output R1 of "00101" in the first adding circuit 105. Thus, the first subtraction result A1 of "00010" and the first borrow output B1 of "0" are outputted.

In this period T4, an inverted value "1" of the binary value "0" of the first borrow output B1 is inputted into the second shift register 106 to be set at the LSB in the content of the register 106. Therefore, the content "00000" of the second shift register 106 is not changed.

Similarly, the decimal number "−3" is subtracted from the second register output R2 of "00000" in the second adding circuit 110. Thus, the second subtraction result A2 of "11101" and the second borrow output B2 of "1" are outputted.

An inverted value "0" of the binary value "1" of the second borrow output B2 is inputted into the third shift register 111 to be set at the LSB in the content of the register 111 in this period T4. Therefore, the content "00000" of the third shift register 111 is not changed.

In the clock period T5 from the time $t_4$ to the time $t_3$, the content of the first shift register 101 is changed to "00100" and this binary content "00100" is outputted as the first register output R1. This is caused by the following reason.

Specifically, since the first borrow output B1 has a binary value "0" in the previous period T4, not only the value "0" in the LSB of the triplet data Y but also a binary value "00100" are simultaneously inputted into the first shift register 101. This binary value "00100" is obtained by shifting the value "00010" in the period T4 toward the MSB by one bit.

The decimal number "−3" is subtracted from the first register output R1 of "00100" in the first adding circuit 105. Thus, the first subtraction result A1 of "00001" and the first borrow output B1 of "1" are outputted.

In this period T5, an inverted value "0" of the binary value "1" of the first borrow output B1 is inputted into the second shift register 106 to be set at the LSB in the content of the register 106. Therefore, the content "11101" of the second shift register 106 is changed to "11110".

Similarly, the decimal number "−3" is subtracted from the second register output R2 of "11110" in the second adding circuit 110. Thus, the second subtraction result A2 of "11110" and the second borrow output B2 of "1" are outputted.

An inverted value "0" of the binary value "1" of the second borrow output B2 is inputted into the third shift register 111 to be set at the LSB in the content of the register 111 in this period T5. Therefore, the content "00000" of the third shift register 111 is not changed.

In the clock period T6 from the time $t_5$ to the time $t_6$, no effective data is inputted into the first shift register 101. This is because the triplet data Y of "3" has a five effective bits and this period T6 corresponds to a sixth bit from the start. Thus, the content of the first subtraction output Al in the previous period T5 with no shifting operation. As a result, the first subtraction output A1 is changed to "11110" and this binary content "11110" is outputted as the first register output R1.

The decimal number "−3" is subtracted from the first register output R1 of "11110" in the first adding circuit 105. Thus, the first subtract result A1 of "11110" and the first borrow output B1 of "0" are outputted in the clock period T6.

In this period T6, an inverted value "1" of the binary value "0" of the first borrow output B1 is inputted into the second shift register 106 to be set at the LSB in the content of the register 106. Therefore, the content "00001" of the second shift register 106 is changed to "00011".

Similarly, the decimal number "−3" is subtracted from the second register output R2 of "00011" in the second adding circuit 110. Thus, the second subtraction result A2 of "00000" and the second borrow output B2 of "0" are outputted.

An inverted value "0" of the binary value "1" of the second borrow output B2 is inputted into the third shift register 111 to be set at the LSB in the content of the register 111 in this period T6. Therefore, the content "00000" of the third shift register 111 is not changed.

In the clock period T7 from the time $t_6$ to the time $t_7$, the value "0" of the first borrow output B1 in the previous clock period T6 is inputted into the first shift register 101. Thus, the content "00001" of the first shift register 101 in the period T6 is changed to "00010". This binary content "00010" is outputted as the first register output R1.

The decimal number "−3" is subtracted from the first register output R1 of "00010" in the first adding circuit 105. Thus, the first subtraction result A1 of "11111" and the first borrow output B1 of "1" are outputted in the clock period T7.

In this period T7, because the first borrow output B1 has a binary value "0" in the previous period T6, the content "00000" of the second subtraction output A2 in the previous period T6 is inputted into the second shift register 106. Therefore, the content "00011" of the second shift register 106 is changed to "00000".

The decimal number "−3" is subtracted from the second register output R2 of "00011" in the second adding circuit 110. Thus, the second subtraction result A2 of "11111" and the second borrow output B2 of "1" are outputted.

An inverted value "1" of the binary value "0" of the second borrow output B2 in the previous period T6 is inputted into the third shift register 111 in this period T7. Therefore, the content "00000" of the third shift register 111 is changed to "00001".

With the above-described operation of the conventional triplet decoding circuit in FIG. 1, the lower two bits "01" in the content "00010" of the first shift register 101 in the period T6 give the original decimal value M3 of the triplet data Y. In other words, M3=1 in the decimal number system.

The lower two bits "01" in the content "00000" of the second shift register 106 in the period T7 give the original decimal value M2 of the triplet data Y. In other words, M2=0 in the decimal number system.

The lower two bits "01" in the content "00001" of the third shift register 11 in the period T7 give the original decimal value M1 of the triplet data Y. In other words, M1=1 in the decimal number system.

Consequently, the triplet data Y is decoded or expanded by substituting the given values M1, M2 and M3 into the above equation (1).

The same operation as above is applicable to the case of a triplet of 5, i.e., Y5, the timing chart of which is shown in FIGS. 3A to 3I.

The operation difference between the two triplet data Y3 and Y5 is that the first and second constants C1 and C2 outputted from the first and second constant generators 102 and 107 are set as "−5" by the selection signals S, and that eight clock periods of T1 to T8 are necessary for obtaining the original decimal values M1, M2, and M3. The other points are the same as those for the triplet of 3, and thus detailed description is omitted here.

In the case of the triplet data Y5, the lower three bits of the first selector output L1 represent the original decimal number M3 contained in the triplet data Y5, the lower three bits of the second selector output L2 represent the original decimal number M2 contained therein, and the lower three bits of the third register output R3 represent the original decimal number M1 contained therein.

As described above, with the conventional triplet decoding circuit in FIG. 1, the triplet data Y is serially inputted into the first shift register 101. Therefore, the decoding or expansion process takes a long time equal to or longer than the clock periods corresponding to the binary data length of the triplet data Y.

Specifically, seven clock periods are required for decoding a triplet of 3, while eight clock periods are required for decoding a triplet of 5.

Further, even when the triplet data Y has a decimal value over the predetermined allowable range (i.e., "1 to 26" for a triplet of 3, and "1 to 124" for a triplet of 5), the above conventional decoding circuit will perform the decoding or expansion processes, resulting in an erroneous output. To prevent this erroneous output, it is necessary to provide a circuit for examining the value of the triplet data Y prior to the decoding process.

However, this examining circuit causes another problem that the circuit scale and the decoding time are increased. For example, the processing time is increased to two times or more. This is because the value of the triplet data Y cannot be examined before all of the data Y are inputted into the conventional decoding circuit, in other words, because a specific time period is required for inputting all the triplet data Y before the decoding or expansion process.

Additionally, the conventional decoding circuit in FIG. 1 requires three shift registers and therefore, there is a disadvantage that the circuit scale is increased even when the above examining circuit is not provided.

SUMMARY OF THE INVENTION

Accordingly, an object of the present invention is to provide a triplet decoding circuit and a triplet decoding method capable of decoding operation in a short time.

Another object of the present invention is to provide a triplet decoding circuit and a triplet decoding method capable of decreasing the circuit scale.

Still another object of the present invention is to provide a triplet decoding circuit and a triplet decoding method that need no examining circuit for examining the data length of a triplet data to prevent an erroneous output.

The above objects together with others not specifically mentioned will become clear to those skilled in the art from the following description.

According to a first aspect of the present invention, a triplet decoding circuit is provided, which includes a data selector, a constant generator, an arithmetic operator, and a priority selector.

The data selector receives first and second input signals and selectively outputs one of the first and second input signals as an output signal according to a selection signal.

The constant generator generates and outputs a constant signal according to the selection signal.

The arithmetic operator receives the output signal (i.e., the first or second input signal) from the data selector and the constant signal from the constant generator. The operator further performs a subtraction operation of the received constant signal from the received output signal and outputs a subtraction result signal and a borrow signal.

The priority selector receives the output signal of the data selector and the subtraction result signal and the borrow signal of the arithmetic operator and outputs first and second output signals.

A triplet data Y is inputted into the data selector as the first input signal. The first output signal of the priority selector is fed back to the data selector and inputted into the data selector as the second input signal.

The triplet data Y is defined by first, second, and third original data M1, M2, M3 according to a specific relationship.

The content of the first output signal of the priority selector is selectively determined from the received output signal of the data selector and the received subtraction result signal of the arithmetic operator according to the content of the borrow signal.

The content of the second output signal of the priority selector is selectively determined from a group of allowable numbers to the first, second, and third original data M1, M2, M3 according to the content of the borrow signal.

When the selection signal has a first value, the second output signal of the priority selector gives the first original data M1 of the triplet data Y, and the second output signal of the priority selector is fed back to the data selector.

When the selection signal has a second value, the first and second output signals of the priority selector give the third and second original data M3 and M2 of the triplet data Y, respectively.

With the triplet decoding circuit according to the first aspect of the present invention, the content of the first output signal of the priority selector is selectively determined from the received output signal of the data selector and the received subtraction results signal of the arithmetic operator according to the content of the borrow signal.

The content of the second output signal of the priority selector is selectively determined from the group of allowable numbers to the first, second, and third original data M1, M2, M3 according to the content of the borrow signal.

Further, when the selection signal has a first value, the second output signal of the priority selector gives the first original data M1 of the triplet data Y, and the second output signal of the priority selector is fed back to the data selector. When the selection signal has a second value, the first and second output signals of the priority selector give the third and second original data M3 and M2 of the triplet data Y, respectively.

Therefore, if the selection signal having the first value is inputted into the data selector and the constant generator in a clock period, and the selection signal having the second value is inputted into the data selector and the constant generator in a subsequent clock period, the first, second, and third original data M1, M2, and M3 of the triplet data Y can be known. This means that the numbers M1, M2, and M3 of the triplet data can be given within only two clock periods.

Accordingly, the triplet decoding operation according to the first aspect can be performed in a short time.

Also, the number of shift registers, each of which requires a large circuit scale, may be decreased to a small value or zero for configuring the triplet decoding circuit according to the first aspect. Therefore, the circuit scale can be decreased.

Moreover, the error of the triplet data Y (or, M1, M2, and M3) may be readily known by examining the borrow signal of the arithmetic operation. As a result, there is no need of examining circuit for examining the data length of the triple data.

In addition, an error detector for examining whether the triplet data Y has any one of the allowable numbers or not may be additionally provided. In this case, it is preferred that the error detection is performed by using the triplet data Y and the selection signal.

In an alternative to this error detector, the constant output section may be designed in such a way that the constant generator outputs an error detection constant to the arithmetic operator and that the operator outputs an error signal according to the operation result.

According to a second aspect of the present invention, a triplet decoding method is provided, in which a triplet data Y is defined as Y=9×M1+3×M2+M3 where M1, M2, and M3 are first, second, and third decimal numbers, respectively.

This method includes the following steps:

A first decimal value of −9 is subtracted from a decimal value of the triplet data Y to generate a first subtraction result. A second decimal value of −18 is subtracted from the value of the triplet data Y to generate a second subtraction result. A third decimal value of −27 is subtracted from the value of the triplet data Y to generate a third subtraction result.

Then, whether each of the first, second, and third subtraction results has a negative polarity or not is judged to know the first decimal number M1.

A provisional triplet data Y' is calculated by subtracting a value of (9×M1) from the value of the triplet data Y.

Further, the first value of −9 is subtracted from a value of the provisional triplet data Y' to generate a fourth subtraction result. The second value of −18 is subtracted from the value of the provisional triplet data Y' to generate a fifth subtraction result. The third value of −27 is subtracted from the value of the provisional triplet data Y' to generate a sixth subtraction result.

Then, whether each of the fourth, fifth, and sixth subtraction results has a negative polarity or not is judged to know the second decimal number M2.

The third decimal number M3 is calculated by subtracting a value of (3×M2) from the value of the provisional triplet data Y'.

With the triplet decoding method according to the second aspect of the present invention, the first, second, and third decimal numbers M1, M2, and M3 can be known in the following way.

The triplet data Y has a value ranging from "0" to "8" when the first decimal number M1 is "0". The triplet data Y has a decimal value ranging from "9" to "17" when the first decimal number M1 is "1". The triplet data Y has a value ranging from "18" to "26" when the first decimal number M1 is "2".

Therefore, if the first decimal number M1 has a value of "0", subtraction of any one of "9", "18", and "27" from the value of the triplet data Y will generate a borrow. If the first decimal number M1 has a value of "1", subtraction of "9" from the value of the triplet data Y will not generate a borrow, while subtraction of either "18" or "27" from the value of the triplet Y will generate a borrow. If the first decimal number M1 has a value of "2", subtraction of either "9" or "18" from the value of the triplet Y will not generate a borrow, while subtraction of "27" from the value of the triplet Y will generate a borrow.

As a result, subtraction of "9", "18", and "27" from the triplet data Y to know the state of the borrow allows the first decimal number M1 to be given.

Once the first decimal number M1 is determined, the value obtained by subtracting the first decimal number M1 multiplied by "9" (i.e., 9×M1) from the triplet Y is (3×M2+M1). This value is defined as the provisional triple data Y', which ranges from "0" to "8".

Therefore, if the second decimal number M2 has a value of "0", subtraction of any one of "3", "6", and "9" from the provisional triplet data Y' will generate a borrow. If the second decimal number M2 has a value of "1", subtraction of either "3" from the provisional triplet data Y' will not generate a borrow, while subtraction of either "6" or "9" from the provisional triplet data Y' will generate a borrow. If the second decimal number M2 has a value of "2", subtraction of either "3" or "6" from the provisional triplet data Y' will not generate a borrow, while subtraction of "9" from the provisional triplet data Y' will generate a borrow.

Therefore, subtracting "3", "6", and "9" from the provisional triplet data Y' to know the state of the borrow allows the second triplet result M2 to be known.

Once the second decimal number M2 is known, the value obtained by subtracting the second decimal number M2 multiplied by "3" from the provisional triplet data Y' provides the third decimal number M3.

According to a third aspect of the present invention, another triplet decoding method is provided, in which a triplet data Y is defined as Y=25×M1+5×M2+M3 where M1, M2, and M3 are first, second, and third decimal numbers, respectively.

This method includes the following steps:

A first decimal value of −25 is subtracted from a decimal value of the triplet data Y to generate a first subtraction result. A second decimal value of −50 is subtracted from the value of the triplet data Y to generate a second subtraction result. A third decimal value of −75 is subtracted from the value of the triplet data Y to generate a third subtraction result. A fourth decimal value of −100 is subtracted from the value of the triplet data Y to generate a fourth subtraction result. A fifth decimal value of −125 is subtracted from the value of the triplet data Y to generate a fifth subtraction result.

Then, whether each of the first, second, third, fourth, and fifth subtraction results has a negative polarity or not is judged to know the first decimal number M1.

A provisional triplet data Y' is calculated by subtracting a value of (25×M1) from the value of the triplet data Y.

Further, the first value of −5 is subtracted from a value of the provisional triplet data Y' to generate a sixth subtraction result. The second value of −10 is subtracted from the value of the provisional triplet data Y' to generate a seventh subtraction result. The third value of −15 is subtracted from the value of the provisional triplet data Y' to generate an eighth subtraction result. The fourth value of −20 is subtracted from the value of the provisional triplet data Y' to generate a ninth subtraction result. The fifth value of −25 is subtracted from the value of the provisional triplet data Y' to generate a tenth subtraction result.

The second number M3 is calculated by subtracting a value of (3×M2) from the value of the provisional triplet data Y'.

Then, whether each of the sixth, seventh, eighth, ninth, and tenth subtraction results has a negative polarity or not is judged to know the second decimal number M2.

The third number M3 is calculated by subtracting a value of (5×M2) from the value of the provisional triplet data Y'.

With the triplet decoding method according to the third aspect of the present invention, the number M1, M2, and M3 can be known in the similar way as described in the method according to the second aspect.

BRIEF DESCRIPTION OF THE DRAWINGS

In order that the invention may be readily carried into effect, it will now be described with reference to the accompanying drawings.

FIGS. 3A to 3I are timing charts showing the operation of the conventional triplet decoding circuit in FIG. 1 for a triplet of 5, respectively.

FIG. 5 is a functional block diagram of the triplet decoding circuit according to the first embodiment in FIG. 4, which shows the detailed configuration of this circuit.

FIG. 8 is a functional block diagram of the triplet decoding circuit according to the second embodiment in FIG. 7, which shows the detailed configuration of this circuit.

DETAILED DESCRIPTION OF THE PREFERRED EMBODIMENTS

Figure 1:
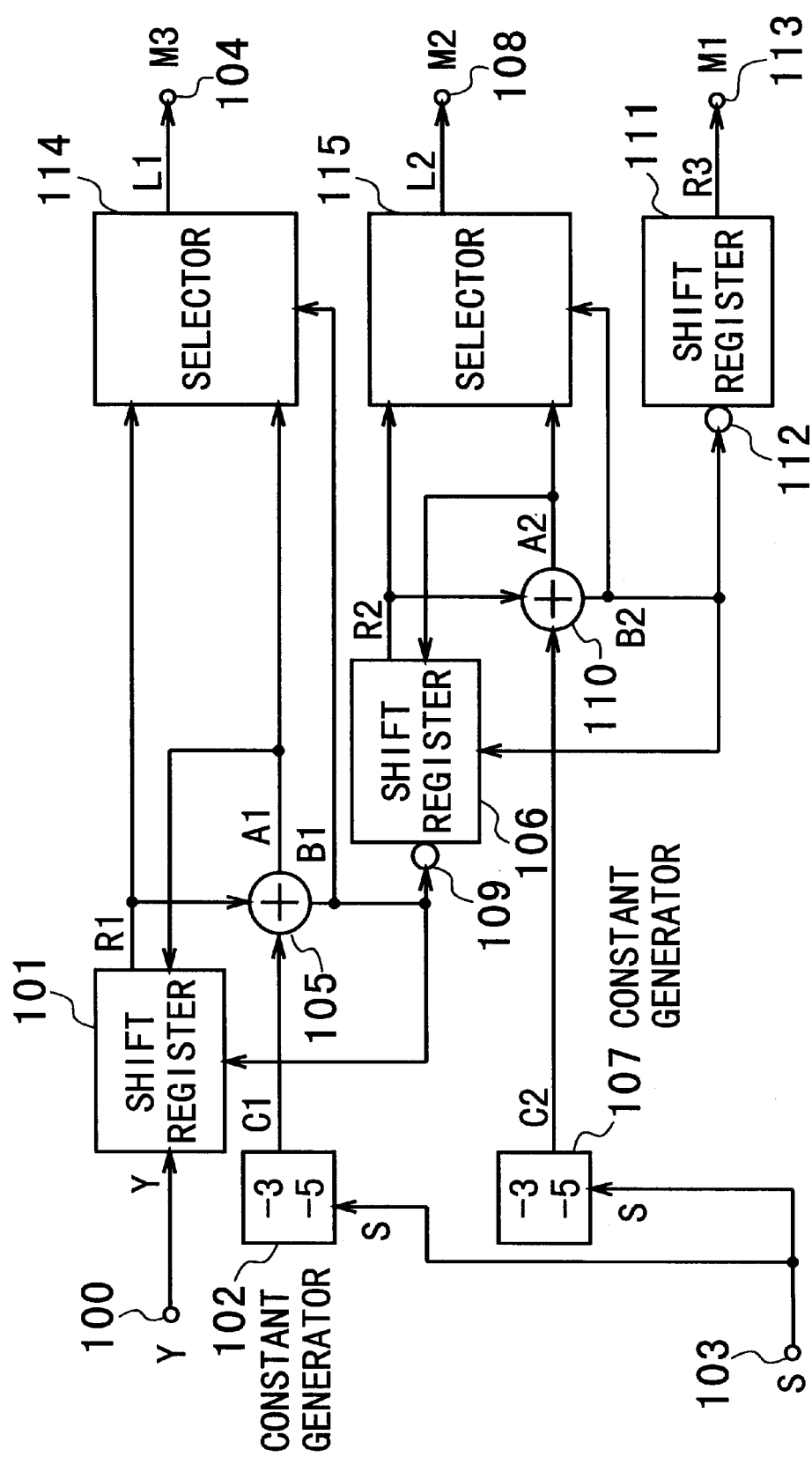
FIG. 1 is a functional block diagram of a conventional triplet decoding circuit.
Figure 2A:
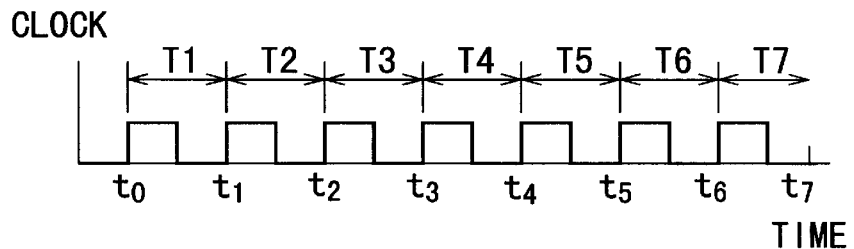
FIGS. 2A to 2I are timing charts showing the operation of the conventional triplet decoding circuit in FIG. 1 for a triplet of 3, respectively.
Figure 2B:
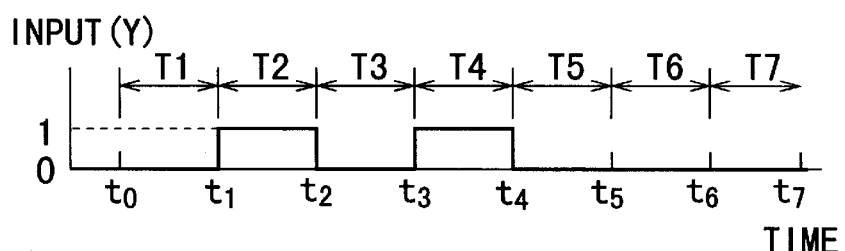
Figure 2C:
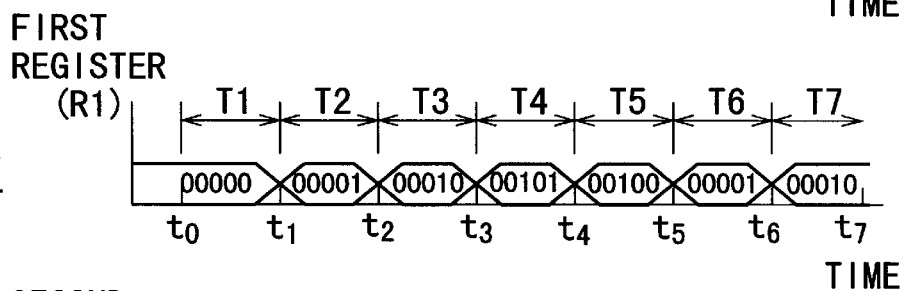
Figure 2D:
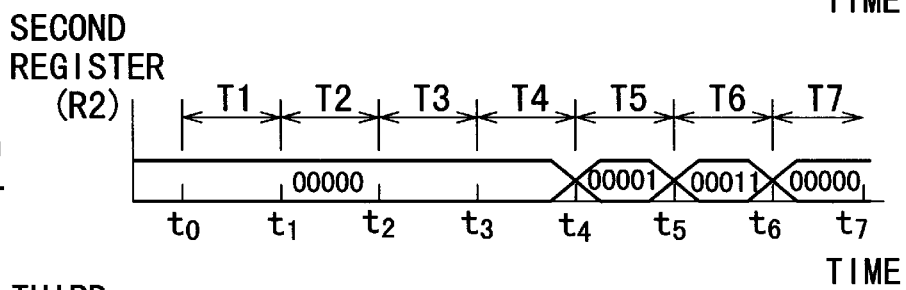
Figure 2E:
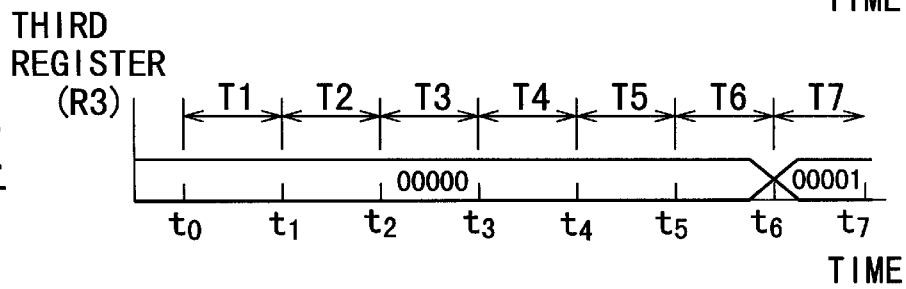
Figure 2F:
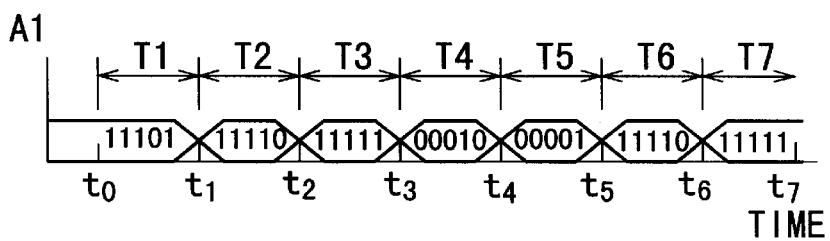
Figure 2G:
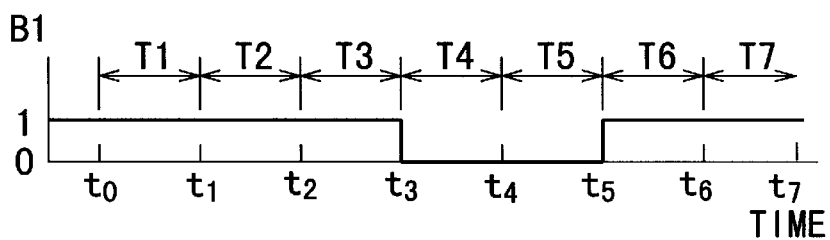
Figure 2H:
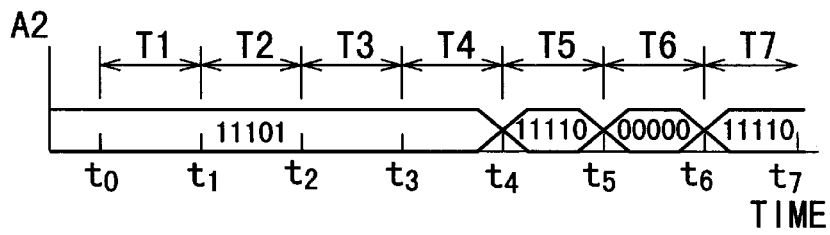
Figure 2I:
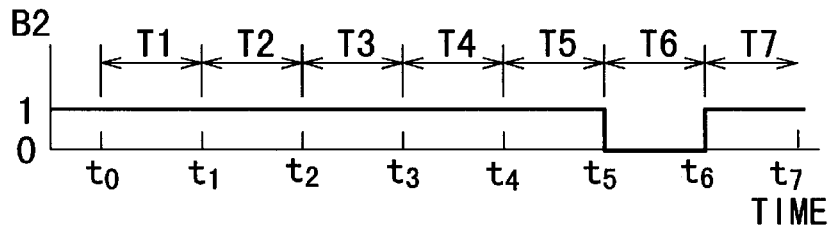
Figure 3F:
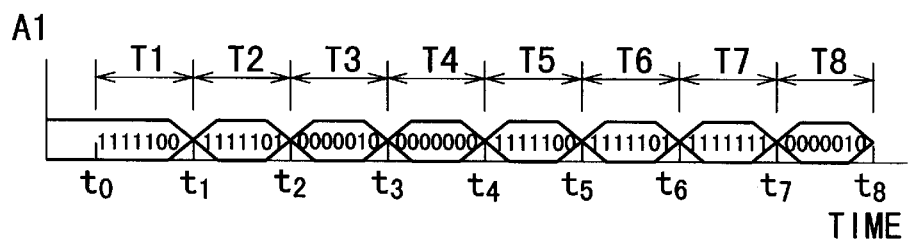
Figure 3G:
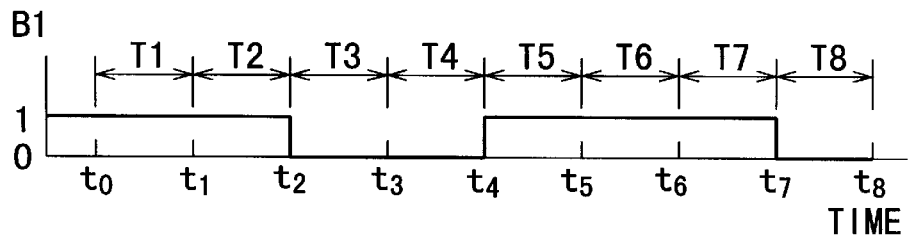
Figure 3H:
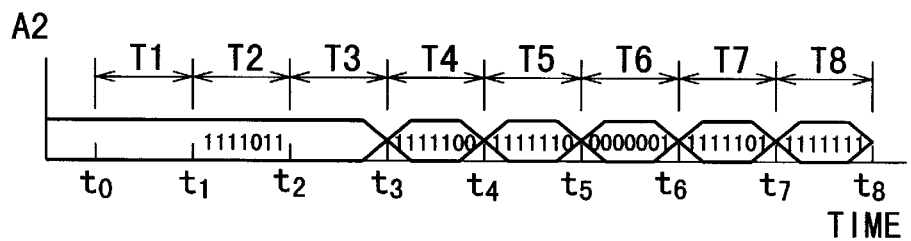
Figure 3I:
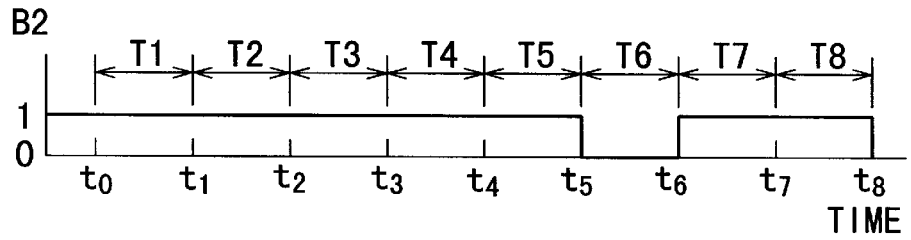

Preferred embodiments of the present invention will be described below referring to the drawings attached.

DECODING PRINCIPLE

First, the decoding principle in the present invention is explained below.

The present invention utilizes the fact that the value of the triplet data Y is in a particular relationship with three original data M1, M2, and M3, which is shown in the above equation (1) and (2).

Table 1 shows the relationship between the value of the triplet data Y3 and the original data M1, M2, and M3 for a triplet of 3.

TABLE 1

| M1 | | 0 | | | 1 | | | 2 | |
|----|---|---|---|---|---|---|---|---|---|
| M2 | 0 | 1 | 2 | 0 | 1 | 2 | 0 | 1 | 2 |
| M3 | 0 | 0 | 0 | 0 | 0 | 0 | 0 | 0 | 0 |
|    | 1 | 1 | 1 | 1 | 1 | 1 | 1 | 1 | 1 |
|    | 2 | 2 | 2 | 2 | 2 | 2 | 2 | 2 | 2 |
| Y3 | 0 | 3 | 6 | 9 | 12 | 15 | 18 | 21 | 24 |
|    | 1 | 4 | 7 | 10 | 13 | 16 | 19 | 22 | 25 |
|    | 2 | 5 | 8 | 11 | 14 | 17 | 20 | 23 | 26 |

As seen from Table 1, for a triplet of 3, the triplet data Y3 has a decimal value ranging from "0" to "8" when the original data M1 is decimally "0". Similarly, the triplet data Y3 has a decimal value ranging from "9" to "17" when the original data M1 is decimally "1", and the triplet data Y3 has a decimal value ranging from "18" to "26" when the original data M1 is decimally "2".

Therefore, if the original data M1 is decimally "0", subtraction of any one of the decimal numbers "9", "18", and "27" from the decimal value of the triplet data Y3 will generate a borrow.

If the original data M1 is decimally "1", although subtraction of "9" from the value of the triplet data Y3 will not generate a borrow, subtraction of either "18" or "27" from the value of the triplet data Y3 will generate a borrow.

If the triplet result M1 is decimally "2", although subtraction of either "9" or "18" from the value of the triplet data Y will not generate a borrow, subtraction of "27" from the value of the triplet data Y3 will generate a borrow.

Accordingly, subtraction of "9", "18", and "27" from the triple data Y3 and examination or checking of the state of the borrow in each case allow the original data M1 to be known.

Once the original data M1 is determined, a value obtained by subtracting the original data M1 multiplied by "9" from the triplet data Y3, which is defined here as a "provisional triplet data Y3'", is expressed as (3×M2+M1). Therefore, Y3'=(3×M2+M1) is established. It is clear that this provisional triplet data Y3' has a value ranging from "0" to "8".

Consequently, if the original data M2 is decimally "0", subtraction of any one of "3", "6", and "9" from the value of the provisional triplet data Y3' will generate a borrow.

If the original data M2 is decimally "1", although subtraction of "3" from the value of the provisional triplet data Y3' will not generate a borrow, subtraction of either "6" or "9" from the value of the provisional triplet data Y3' will generate a borrow.

If the original data M2 is decimally "2", although subtraction of either "3" or "6" from the value of the provisional triplet data Y3' will not generate a borrow, subtraction of "9" from the value of the provisional triplet data Y3' will generate a borrow.

Accordingly, subtraction of "3", "6", and "9" from the provisional triplet data Y3' and examination or checking of the state of the borrow in each case allow the original data M2 to be known.

Once the original data M2 is known, the original data M3 is given by a value obtained by subtracting the value of the original data M2 multiplied by "3" from the provisional triplet data Y3' (i.e., Y3'−3×M2=M3)

The same description as above for Y3 is applicable to a triplet of 5, i.e., Y5. In this case, the values to be subtracted for obtaining the original data M1 are set as "25", "50", "75", "100", and "125". Also, the values to be subtracted for obtaining the original data M2 are "5", "10", "15", "20", and "25".

FIRST EMBODIMENT

Figure 4:
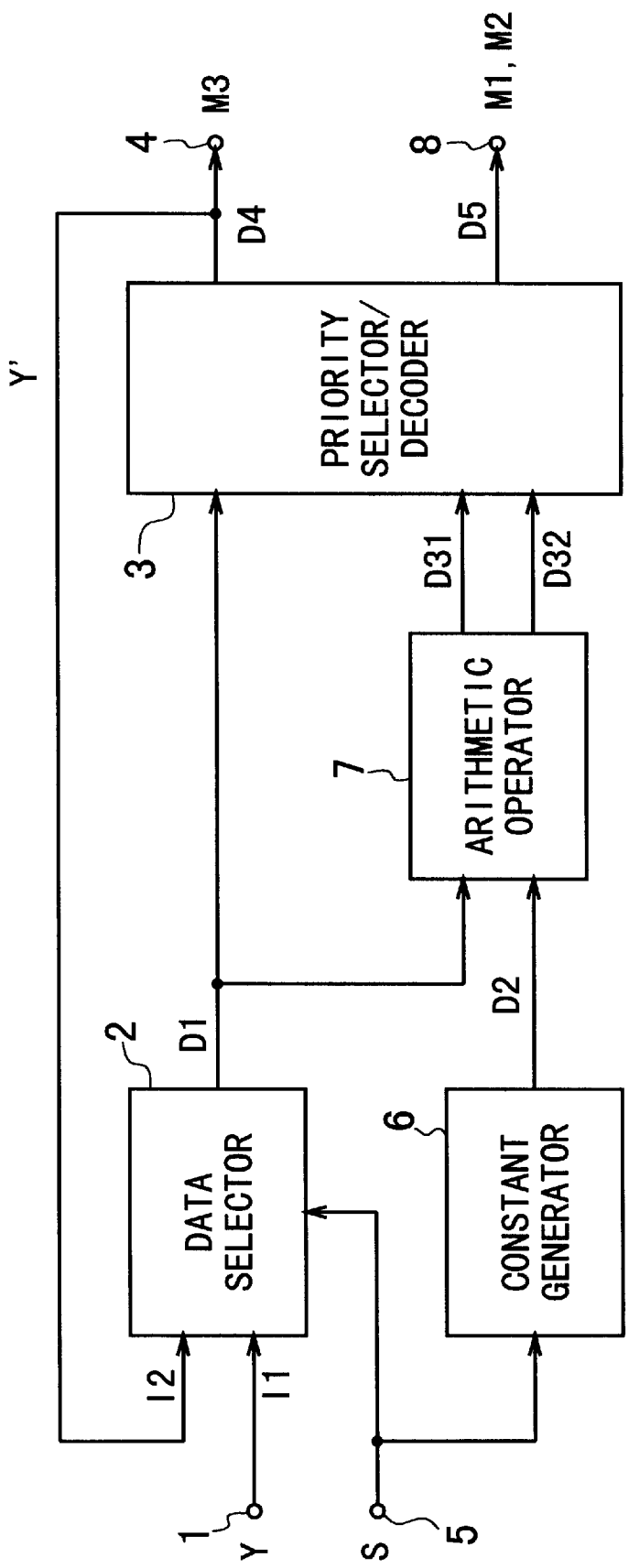
FIG. 4 is a functional block diagram of a triplet decoding circuit according to a first embodiment of the present invention.
Figure 6A:
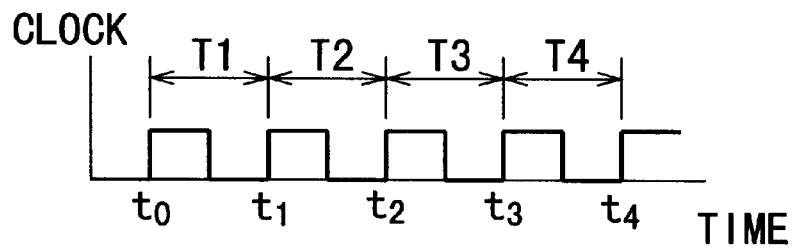
FIGS. 6A to 6I are timing charts showing the operation of the triplet decoding circuit according to the first embodiment in FIGS. 4 and 5, respectively.
Figure 6B:
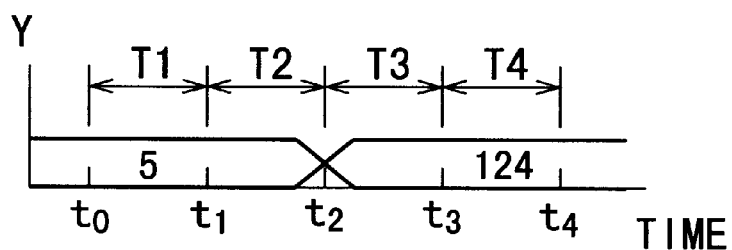
Figure 6C:
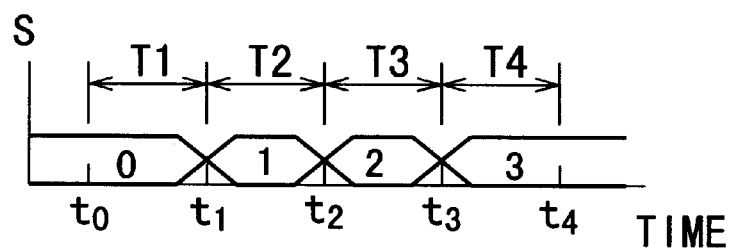
Figure 6D:
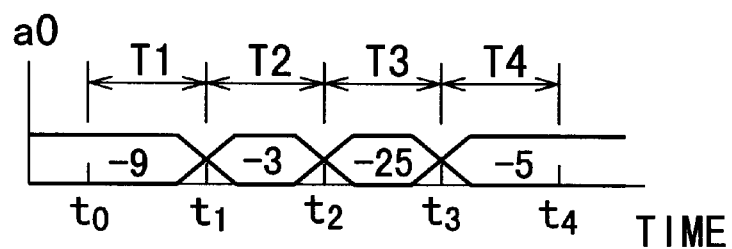
Figure 6E:
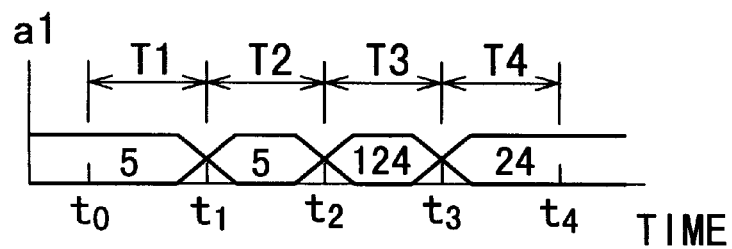
Figure 6F:
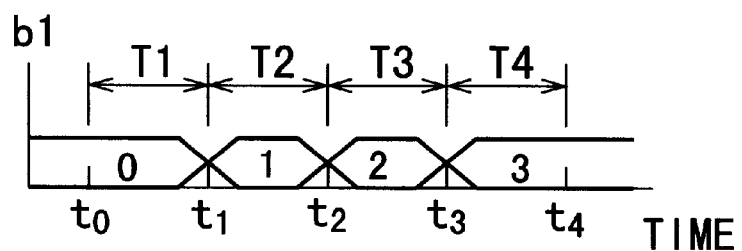
Figure 6G:
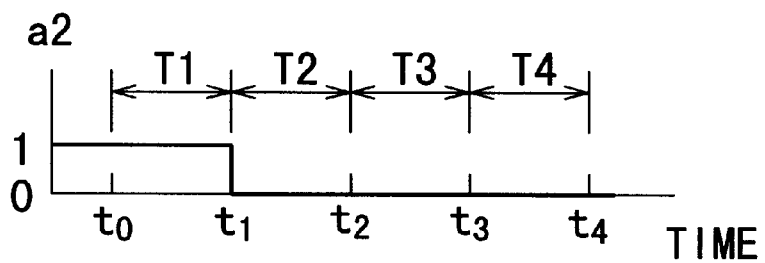
Figure 6H:
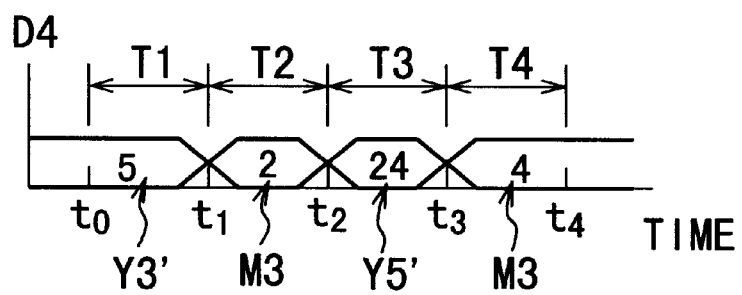
Figure 6I:
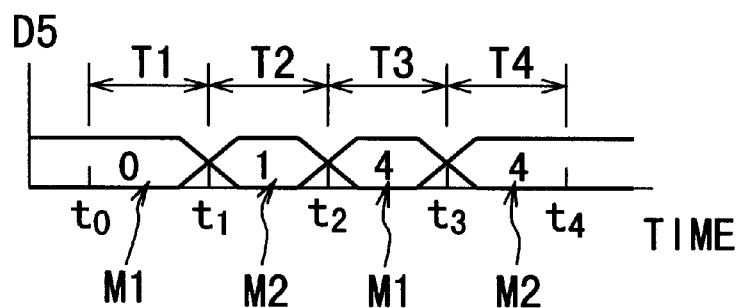

A triplet decoding circuit according to a first embodiment of the present invention has a basic configuration as shown in FIG. 4.

As shown in FIG. 4, the triplet decoding circuit according to the first embodiment includes a data selector 2, a constant generator 6, an arithmetic operator 7, and a priority selector/decoder 3.

The data selector 2 receives first and second input signals I1 and I2 and selectively outputs one of the first and second input signals I1 and I2 as an output signal D1 in parallel according to a selection signal S. The selection signal S is inputted through an input terminal 5.

The constant generator 6 generates and outputs a constant signal D2 according to the selection signal S.

The arithmetic operator 7 receives the output signal D1 (i.e., the first or second input signal I1 or I2) from the data selector 2 and the constant signal D2 from the constant generator 6. The operator 7 further performs a subtraction operation of the received constant D2 from the received output signal D1 and outputs a subtraction result signal D31 and a borrow signal D32.

The priority selector/decoder 3 receives the output signal D1 of the data selector 2 and the subtraction result signal D31 and the borrow signal D32 of the arithmetic operator 7, and outputs first and second output signals D4 and D5. The first output signal D4 is derived from a first output terminal 4. The second output signal D5 of the priority selector/decoder 3 is derived from a second output terminal 8.

A triplet data Y is inputted in parallel into the data selector 2 as the first input signal I1 through an input terminal 1. The first output signal D4 of the priority selector/decoder 3 is fed back to the data selector 2 and inputted into the data selector 2 as the second input signal I2.

The triplet data Y is defined by first, second, and third original data M1, M2, M3 according to a specific relationship.

The content of the first output signal D4 of the priority selector/decoder 3 is selectively determined from the received output signal D1 of the data selector 2 and the received subtraction result signal D31 of the arithmetic operator 7 according to the content of the borrow signal D32. For example, the content of the first output signal D4 is determined by selecting any one of the output signal D1 and the subtraction result signal D31 according to the content of the borrow signal D32 with a specific priority.

The content of the second output signal D5 of the priority selector/decoder 3 is selectively determined from a group of allowable numbers to the first, second, and third original data M1, M2, M3 according to the content of the borrow signal D32. For example, the content of the second output signal D5 is determined by decoding the content of the borrow signal D32 along a specific rule.

When the selection signal S has a first value, the second output signal D5 of the priority selector/decoder 3 gives the first original data M1 of the triplet data Y, and the second output signal D4 of the priority selector/decoder 3 is fed back to the data selector 2.

When the selection signal S has a second value, the first and second output signals D4 and D5 of the priority selector/decoder 3 give the third and second original data M3 and M2 of the triplet data Y, respectively.

With the triplet decoding circuit according to the first embodiment, the content of the first output signal D4 of the priority selector/decoder 3 is selectively determined from the received output signal D1 of the data selector 2 and the received subtraction result signal D31 of the arithmetic operator 7 according to the content of the borrow signal D32.

The content of the second output signal D5 of the priority selector/decoder 3 is selectively determined from the group of allowable numbers to the first, second, and third original data M1, M2, M3 according to the content of the borrow signal D32.

Further, when the selection signal S has a first value, the second output signal D4 of the priority selector/decoder 3 gives the first original data M1 of the triplet data Y, and the second output signal D4 of the priority selector/decoder 3 is fed back to the data selector 2. When the selection signal S has a second value, the first and second output signals D4 and D5 of the priority selector/decoder 3 give the third and second original data M3 and M2 of the triplet data Y, respectively.

Therefore, if the selection signal S having the first value is inputted into the data selector 2 and the constant generator 6 in a clock period, and the selection signal S having the second value is inputted into the data selector 2 and the constant generator 6 in a subsequent clock period, the first, second, and third original data M1, M2, and M3 of the triplet data Y can be known. This means that the numbers M1, M2, and M3 of the triplet data Y can be given within only two clock periods.

Accordingly, the triplet decoding operation can be performed in a short time.

Also, the number of shift registers, each of which requires a large circuit scale, may be decreased to zero for configuring the triplet decoding circuit according to the first embodiment. Therefore, the circuit scale can be decreased.

Moreover, the error of the triplet data Y (or, M1, M2, and M3) may be readily known by examining the borrow signal D32 of the arithmetic operator 3. As a result, there is no need of examining circuit for examining the data length of the triple data.

FIG. 5 shows a detailed configuration of the decoding circuit in FIG. 4, in which four decimal numbers of "0", "1", "2", and "3" are alternately inputted as the selection signal S.

The content of the constant signal D2 is directly shown in the box representing the constant generator 6 in FIG. 5. The constant signal D2 contains first, second, third, fourth, and fifth sets of constants.

The arithmetic operator 7 includes first, second, third, fourth, and fifth adding circuits 25a, 25b, 25c, 25d, and 25e. The first, second, third, fourth, and fifth sets of constants generated by the constant generator 6 are sent to the corresponding adding circuits 25a, 25b, 25c, 25d, and 25e as the first, second, third, fourth, and fifth constant signals a0, b0, c0, d0, and e0.

The first to fifth constant signals a0, b0, c0, d0, and e0 are subtracted from the output signal D1 of the data selector 2 in the adding circuits 25a, 25b, 25c, 25d, and 25e, respectively. Thus, first, second, third, fourth, and fifth subtraction result signals a1, b1, c1, d1, and e1 and first, second, third, fourth, and fifth borrow signals a2, b2, c2, d2, and e2 are outputted from the adding circuits 25a, 25b, 25c, 25d, and 25e to the priority selector/decoder 3.

The operation of the constant generator 6 is shown in Table 2.

TABLE 2

| SELECTION SIGNAL S | OUTPUT SIGNAL D2 OF THE CONSTANT GENERATOR | | | | |
|---|---|---|---|---|---|
| | a0 | b0 | c0 | d0 | e0 |
| 0 | −9 | −18 | −27 | 0 | 0 |
| 1 | −3 | −6 | −9 | 0 | 0 |
| 2 | −25 | −50 | −75 | −100 | −125 |
| 3 | −5 | −10 | −15 | −20 | −25 |

As seen from Table 2, each of the first to fifth constant signals a0, b0, c0, d0, and e0 has various values according to the value (0, 1, 2, or 3) of the selection signal S. These values are determined according to the above-described decoding principle. The above two sets of the constants for the selection signal values of 0 and 1 are used for a triplet of 3. The lower two sets of the constants for the selection signal values of 2 and 3 are used for a triplet of 5.

The content of the first and second output signals D4 and D5 of the priority selector/decoder 3 are shown in Table 3.

TABLE 3

| SELECTION SIGNAL S | OUTPUT SIGNALS D4 AND D5 OF PRIORITY SELECTOR/DECODER |
|---|---|
| 0 | M1 (TRIPLET OF 3) |
| 1 | M2 & M3 (TRIPLET OF 3) |
| 2 | M1 (TRIPLET OF 5) |
| 3 | M2 & M3 (TRIPLET OF 5) |

As seen from Table 3, the content of the first and second output signals D4 and D5 of the priority selector/decoder 3 is changed according to the value of the selection signal S.

When the selection signal S is "0", the original data M1 of a triplet 3 is outputted in the second output signal D5. When the selection signal S is "1", the original data M2 and M3 of a triplet 3 are outputted in the second and first output signals D5 and D4, respectively.

When the selection signal S is "2", the original data M1 of a triplet 5 is outputted in the second output signal D5. When the selection signal S is "3", the original data M2 and M3 of a triplet 5 are outputted in the second and first output signals D5 and D4, respectively.

The relationship of the operation of the priority selector/decoder 3 with the borrow signal D32 is shown in Table 4.

TABLE 4

| CASE NO. | BORROW SIGNAL D32 (a2, b2, c2, d2, e2) | OUTPUT D4 (M3) | OUTPUT D5 (M1, M2) |
|---|---|---|---|
| 1 | (11111) | a1 | 0 |
| 2 | (01111) | b1 | 1 |
| 3 | (00111) | c1 | 2 |
| 4 | (00011) | d1 | 3 |
| 5 | (00001) | e1 | 4 |
| 6 | (00000) | ERROR | ERROR |

As seen from Table 4, the first borrow signal a2 is in the highest priority, and the fifth borrow signal a5 is the lowest priority. Therefore, if the first borrow signal a2 has a value "1" (i.e., logic high), the first borrow signal a2 is always outputted as the first output signal D4 independent of the values of the second to fifth borrow signals b2, c2, d2, and e2.

Specifically, when the values of the first to fifth borrow signals a2, b2, c2, d2, and e2 are all "1", the first output signal D4 has a same value as that of the first subtraction result signal a1 and the second output signal D5 has a value "0". This means that the first and second original data M1 and M2 have a same value "0" and the third original data M3 has the value of the first subtraction result signal a1.

When the value of the first borrow signal a2 is "0" and the values of the second to fifth borrow signals b2, c2, d2, and e2 are all "1", the first output signal D4 has a same value as that of the second subtraction result signal b1 and the second output signal D5 has a value "1". This means that the first and second original data M1 and M2 have a same value "1" and the third original data M3 has the value of the second subtraction result signal b1.

When the values of the first and second borrow signals a2 and b2 are "0" and the values of the third to fifth borrow signals c2, d2, and e2 are "1", the first output signal D4 has a same value as that of the third subtraction result signal c1 and the second output signal D5 has a value "2". This means that the first and second original data M1 and M2 have a same value "2" and the third original data M3 has the value of the second subtraction result signal c1.

When the values of the first, second, and third borrow signals a2, b2, and c2 are "0" and the values of the fourth and fifth borrow signals d2 and e2 are "1", the first output signal D4 has a same value as that of the fourth subtraction result signal d1 and the second output signal D5 has a value "3". This means that the first and second original data M1 and M2 have a same value "3" and the third original data M3 has the value of the fourth subtraction result signal d1.

When the values of the first to fourth borrow signals a2, b2, c2, and d2 are "0" and the value of the fifth borrow signal e2 is "1", the first output signal D4 has a same value as that of the fifth subtraction result signal e1 and the second output signal D5 has a value "4". This means that the first and second original data M1 and M2 have a same value "4" and the third original data M3 has the value of the fifth subtraction result signal e1.

When the values of the first to fifth borrow signals a2, b2, c2, d2, and e2 are all "0", this case is erronous.

Case Nos. 1, 2, 3, and 6 are applicable to a triplet of 3. On the other hand, Case Nos. 1, 2, 3, 4, 5, and 6 are applicable to a triplet of 5.

In the clock period where the first original data M1 is outputted to the terminal 8, the provisional triplet data Y' outputted as the first output signal D4 is fed back to the data selector 2.

The timing control of output of the first to third original data M3, M2, and M1 and the provisional triplet data Y' is performed by selecting any one of the values of the selection signal S, as already shown in Table 2. the value "0" or "1" is selected for a triplet of 3. The value "2" or "3" is selected for a triplet of 5.

Next, the operation of the triplet decoding circuit according to the first embodiment in FIGS. 4 and 5 is explained below referring to FIGS. 6A to 6I.

It is assumed that the triplet data Y, which is a triplet of 5, has a decimal value of "124".

In the clock period T1 from the time $t_0$ to the time $t_1$, the value "0" is selected as the selection signal S. In this case, the set of the constants "–9", "–18", "–27", "0", and "0" are outputted from the constant generator 6 to the arithmetic operator 7. The first to fifth borrow signals a2, b2, c2, d2, and e2 all have a value "1". Therefore, a value "0" is outputted as the second output signal D5 for the original data M1 and at the same time, the provisional triplet data Y' (=5) is fed back to the data selector 2.

In the clock period T2 from the time $t_1$ to the time $t_2$, the value "1" is selected as the selection signal S. In this case, the set of the constants "–3", "–6", "–9", "0", and "0" are outputted from the constant generator 6 tothe arithmetic operator 7. The first borrow signal a2 has a value "0" and the second to fifth borrow signals b2, c2, d2, and e2 have a value "1". Therefore, a value "1" is outputted as the second output signal D5 for the original data M2 and at the same time, a value "2" is outputted as the first output signal D4 for the original data M3.

Thus, the values "0", "1", and "2" for the three original data M1, M2, and M3 are obtained in only two clock periods.

The same description as above is applicable to the operation in the subsequent clock periods T3 and T4 for a triplet of 5. In these periods T3 and T4, a same value "4" is obtained for the three original data M1, M2, and M3. It is clear that the triplet data Y has a decimal value of "124" in this case, also.

With the triplet decoding circuit according to the first embodiment, a triplet data having a value over the allowable range, such as a value exceeding "27" for a triplet of 3 and that exceeding "125" for a triplet of 5, can be easily detected in decoding process.

Specifically, if the selection signal S is "0" and the borrow signal c2 is "0". Thus, it can be judged to be an error for a triplet of 3. If the selection signal S is "2" and the borrow signal e2 is "0", it can be judged to be an error for a triplet of 5.

Figure 7:
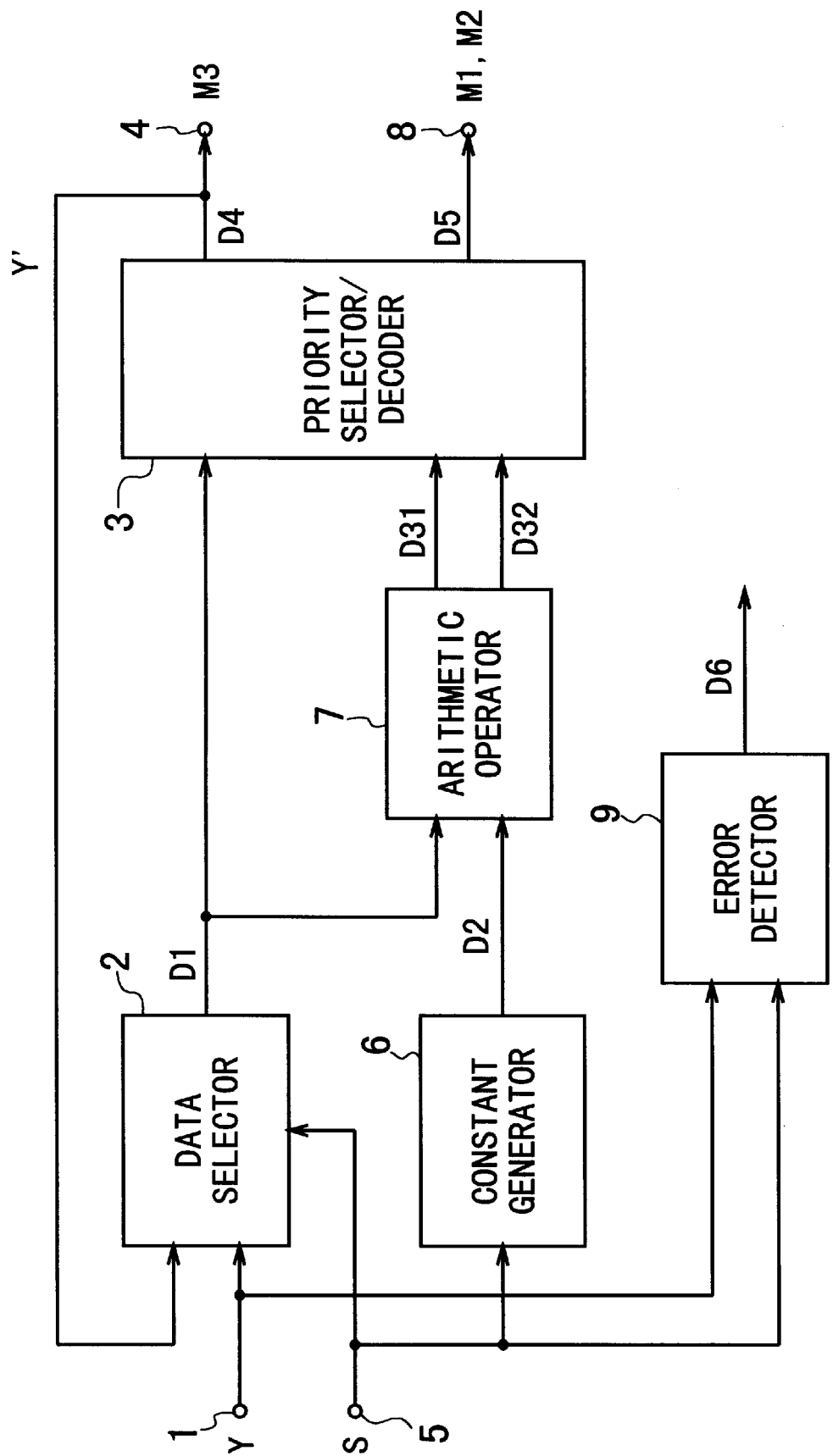
FIG. 7 is a functional block diagram of a triplet decoding circuit according to a second embodiment of the present invention.

Also, when the selection signal S is "1" for a triplet of 3, or when the selection signal S is "3" for a triplet of 5, the borrow signal c2 of e2 allows detection of an error. FIG. 7 shows an example of a circuit configuration with which this judgement can be made with ease.

SECOND EMBODIMENT

FIGS. 7 and 8 show a triplet decoding circuit according to a second embodiment, which has the same configuration as that of the first embodiment, except that an error detector 9 outputting an error detection signal D6 is additionally provided. Therefore, the explanation about the same configuration is omitted here by adding the same reference characters or numerals to the corresponding elements in FIGS. 7 and 8 for the sake of simplification of description.

As shown in FIG. 8, the error detector 9 includes an inverter 34 serving as an error judgment device. The borrow signal e2 is applied to the error detector 9 so that error detection can be made in the same way either for a triplet of 3 or for that of 5. Thus, when the selection signals S is selected as "0" for a triplet of 3, a constant "-27" is delivered as the constant e0 to the adding circuit 25e. A constant "-9" is applied as the constant "e0" to the adding circuit 25e when the selection signal S is "1". Therefore, a same value as that of the borrow signal c2 is given to the borrow signal e2.

Consequently, an error output of the triplet decoding circuit according to the second embodiment can be detected using the error detection signal D6 for both triplets of 3 and 5.

The operation of the constant generator 6 is shown in Table 5.

TABLE 5

| SELECTION | OUTPUT SIGNAL D2 OF THE CONSTANT GENERATOR | | | | |
|---|---|---|---|---|---|
| SIGNAL S | a0 | b0 | c0 | d0 | e0 |
| 0 | −9 | −18 | −27 | 0 | −27 |
| 1 | −3 | −6 | −9 | 0 | −9 |
| 2 | −25 | −50 | −75 | −100 | −125 |
| 3 | −5 | −10 | −15 | −20 | −25 |

As seen from Table 5, similar to the first embodiment, each of the constant signals a0, b0, c0, d0, and e0 has different values according to the value of the selection signal S. However, there is the following differences.

In Table 5, the constant e0 has a value "-27" or "-9" when the selection signal S has a value "0" or "1", which is used for a triplet of 3. Therefore, an error can be readily detected without a dedicated error detector.

For the case of triplet of 5, an error may be detected by examining the borrow signal e2.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A triplet decoding circuit comprising:
   (a) a data selector receiving first and second input signals and selectively outputting one of said first and second input signals as an output signal according to a selection signal;
      a triplet data Y being inputted into said data selector as said first input signal;
      said triplet data Y being defined by first, second, and third original data M1, M2, and M3 according to a specific relationship;
   (b) a constant generator generating and outputting a constant signal according to said selection signal;
   (c) an arithmetic operator receiving said output signal from said data selector and said constant signal from said constant generator;
      said operator performing a subtraction operation of said received constant signal from said received output signal and outputting a subtraction result signal and a borrow signal; and
   (d) a priority selector receiving said output signal of said data selector and said subtraction result signal and said borrow signal of said arithmetic operator and outputting first and second output signals;
      said first output signal of said priority selector being fed back to said data selector and being inputted into said data selector as said second input signal;
      wherein the content of said first output signal of said priority selector is selectively determined from said received output signal of said data selector and said received subtraction result signal of said arithmetic operator according to said content of said borrow signal;
      and wherein the content of said second output signal of said priority selector is selectively determined from a group of allowable numbers to said first, second, and third original data M1, M2, M3 according to the content of said borrow signal;
      and wherein when said selection signal has a first value, said second output signal of said priority selector gives said first original data M1 of said triplet data Y, and said second output signal of said priority selector is fed back to said data selector;
      and wherein when said selection signal has a second value, said first and second output signals of said priority selector give said third and second original data M3 and M2 of said triplet data Y, respectively.

2. A circuit as claimed in claim 1, further comprising an error detector for examining whether said triplet data Y has any one of the allowable numbers or not.

3. A circuit as claimed in claim 2, wherein the error detection is performed by using said triplet data Y and said selection signal.

4. A circuit as claimed in claim 2, wherein said constant generator is designed in such a way that said constant generator outputs an error detection constant to said arithmetic operator and that said operator outputs an error signal according to said operation result.

5. A circuit as claimed in claim 1, wherein M1=9, M2=3 and M3=1.

6. A circuit as claimed in claim 5, wherein said arithmetic operator includes at least three adding circuits;
   and wherein each of said adding circuits performs an adding operation of said output signal from said data selector and said constant signal from said constant generator, and outputs an addition result and a borrow signal to said priority selector.

7. A circuit as claimed in claim 6, wherein said selection signal has first and second values;

and wherein when said selection signal has said first value, said data selector outputs said triplet data Y as said output signal of said data selector, and said constant generator outputs a set of numbers "−9", "−18", and "−27" as said constant signal;

and wherein when said selection signal has said second value, said data selector outputs a provisional triplet data Y' as said output signal of said data selector, and said constant generator outputs a set of three numbers "−3", "−6", and "−9" as said constant signal.

8. A circuit as claimed in claim 1, wherein M1=25, M2=5 and M3=1.

9. A circuit as claimed in claim 8, wherein said arithmetic operator includes at least five adding circuits;

and wherein each of said adding circuits performs an adding operation of said output signal from said data selector and said constant signal from said constant generator, and outputs an addition result signal and a borrow signal to said priority selector.

10. A circuit as claimed in claim 9, wherein said selection signal has first and second values;

and wherein when said selection signal has said first value, said data selector outputs said triplet data Y as said output signal of said data selector, and said constant generator outputs a set of numbers "−25", "−50", "−75", "−100" and "−125" as said constant signal;

and wherein when said selection signal has said second value, said data selector outputs a provisional triplet data Y' as said output signal of said data selector, and said constant generator outputs a set of five numbers "−5", "−10", "−15", "−20" and "−25" as said constant signal.

11. A triplet decoding method in which a triplet data Y is defined as Y=9×M1+3×M2+M3 where M1, M2, and M3 are first, second, and third decimal numbers, respectively; said method comprising the steps of:

(a) subtracting a first decimal value of −9 from a decimal value of said triplet data Y to generate a first subtraction result;

(b) subtracting a second decimal value of −18 from the value of said triplet data Y to generate a second subtraction result;

(c) subtracting a third decimal value of −27 from the value of said triplet data Y to generate a third subtraction result;

(d) judging whether each of said first, second, and third subtraction results has a negative polarity or not to know said first decimal number M1;

(e) calculating a provisional triplet data Y' by subtracting a value of (9×M1) from the value of said triplet data Y;

(f) subtracting the first value of −9 from a value of said provisional triplet data Y' to generate a fourth subtraction result;

(g) subtracting the second value of −18 from the value of said provisional triplet data Y' to generate a fifth subtraction result;

(h) subtracting the third value of −27 from the value of said provisional triplet data Y' to generate a sixth subtraction result;

(i) judging whether each of said fourth, fifth, and sixth subtraction results has a negative polarity or not to know said second decimal number M2; and (j) calculating the third decimal number M3 by subtracting a value of (3×M2) from the value of said provisional triplet data Y'.

12. A method as claimed in claim 11, wherein said first original data M1 is set as "0", when said first subtraction result has a negative value;

"1", when said first subtraction result has a positive value and said second subtraction result has a negative value;

"2", when said second subtraction result has a positive value and said third subtraction result has a negative value;

and wherein said second original data M2 is set as

"0", when said fourth subtraction result has a negative value;

"1", when said fourth subtraction result has a positive value and said fifth subtraction result has a negative value;

"2", when said fifth subtraction result has a positive value and said sixth subtraction result has a negative value.

13. A triplet decoding method in which a triplet data Y is defined as Y=25×M1+5×M2+M3 where M1, M2, and M3 are first, second, and third decimal numbers, respectively; said method comprising the steps of:

(a) subtracting a first decimal value of −25 from a decimal value of said triplet data Y to generate a first subtraction result;

(b) subtracting a second decimal value of −50 is subtracted from the value of the triplet data Y to generate a second subtraction result;

(c) subtracting a third decimal value of −75 from the value of said triplet data Y to generate a third subtraction result;

(d) subtracting a fourth decimal value of −100 from the value of said triplet data Y to generate a fourth subtraction result;

(e) subtracting a fifth decimal value of −125 is subtracted from the value of the triplet data Y to generate a fifth subtraction result;

(f) judging whether each of said first, second, third, fourth, and fifth subtraction results has a negative polarity or not to know said first decimal number M1.

(g) calculating a provisional triplet data Y' by subtracting a value of (25×M1) from the value of said triplet data Y;

(h) subtracting the first value of −5 from a value of said provisional triplet data Y' to generate a sixth subtraction result;

(i) subtracting the second value of −10 from the value of said provisional triplet data Y' to generate a seventh subtraction result;

(j) subtracting the third value of −15 from the value of said provisional triplet data Y' to generate an eighth subtraction result;

(k) subtracting the fourth value of −20 from the value of said provisional triplet data Y' to generate a ninth subtraction result;

(l) subtracting the fifth value of −25 from the value of said provisional triplet data Y' to generate a tenth subtraction result;

(m) subtracting the second number M3 by subtracting a value of (3×M2) from the value of said provisional triplet data Y';

(n) judging whether each of said sixth, seventh, eighth, ninth, and tenth subtraction results has a negative polarity or not to know said second decimal number M2;

(o) subtracting the third number M3 by subtracting a value of (5×M2) from the value of said provisional triplet data Y'.

14. A method as claimed in claim 13, wherein said first original data M1 is set as "0", when said first subtraction result has a negative value;

"1", when said first subtraction result has a positive value and said second subtraction result has a negative value;

"2", when said second subtraction result has a positive value and said third subtraction result has a negative value;

"3", when said third subtraction result has a positive value and said fourth subtraction result has a negative value;

"4", when said fourth subtraction result has a positive value and said fifth subtraction result has a negative value;

and wherein said second original data M2 is set as

"0", when said sixth subtraction result has a negative value;

"1", when said sixth subtraction result has a positive value and said seventh subtraction result has a negative value;

"2", when said seventh subtraction result has a positive value and said eighth subtraction result has a negative value;

"3", when said eighth subtraction result has a positive value and said ninth subtraction result has a negative value;

"4", when said ninth subtraction result has a positive value and said tenth subtraction result has a negative value.

* * * * *